United States Patent
Kitamura

(10) Patent No.: US 9,941,325 B2
(45) Date of Patent: Apr. 10, 2018

(54) METHOD OF MANUFACTURING SOLID-STATE IMAGE SENSOR

(71) Applicant: CANON KABUSHIKI KAISHA, Tokyo (JP)

(72) Inventor: Shingo Kitamura, Chigasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/200,349

(22) Filed: Jul. 1, 2016

(65) Prior Publication Data

US 2017/0018596 A1 Jan. 19, 2017

(30) Foreign Application Priority Data

Jul. 13, 2015 (JP) .................................. 2015-140060

(51) Int. Cl.
 *H01L 27/146* (2006.01)
(52) U.S. Cl.
 CPC .. *H01L 27/14685* (2013.01); *H01L 27/14629* (2013.01); *H01L 27/14636* (2013.01)
(58) Field of Classification Search
 USPC .......................................................... 438/69
 See application file for complete search history.

(56) References Cited

U.S. PATENT DOCUMENTS

| | | | |
|---|---|---|---|
| 7,145,194 B2 * | 12/2006 | Nishida | G11C 11/4125 257/296 |
| 7,442,973 B2 | 10/2008 | Komoguchi et al. | |
| 7,488,615 B2 * | 2/2009 | Uya | H01L 27/14625 257/290 |
| 7,666,704 B2 * | 2/2010 | Suzuki | H01L 27/1462 438/57 |

(Continued)

FOREIGN PATENT DOCUMENTS

| | | |
|---|---|---|
| JP | 6-120471 A | 4/1994 |
| JP | 2003-224249 A | 8/2003 |

(Continued)

OTHER PUBLICATIONS

JP 2008-103757, U.S. Pat. No. 7,442,973 B2, U.S. Pat. No. 7,842,986 B2.

(Continued)

*Primary Examiner* — Marcos D Pizarro
*Assistant Examiner* — Lawrence Tynes, Jr.
(74) *Attorney, Agent, or Firm* — Fitzpatrick, Cella, Harper & Scinto

(57) ABSTRACT

A method of manufacturing a solid-state image sensor, the method comprising preparing a structure including a substrate and an insulating member provided thereon, the substrate including a photoelectric conversion portion, forming a first opening in the insulating member, the first opening having a bottom face at a position higher than an upper face of the substrate and an inclined first face, forming a first (Continued)

member to fill the first opening, forming a second opening in the first member, forming a third opening, having a second face, in the insulating member by etching part of the insulating member under the second opening using the first member, and forming a second member to fill the third opening, wherein the inclined angle of the first face is smaller than that of the second face.

18 Claims, 6 Drawing Sheets

(56) References Cited

U.S. PATENT DOCUMENTS

| | | | |
|---|---|---|---|
| 7,842,986 B2 | 11/2010 | Komoguchi et al. | |
| 8,187,905 B2* | 5/2012 | Yin | H01L 27/14627 |
| | | | 257/233 |
| 8,477,223 B2* | 7/2013 | Itonaga | H01L 27/14621 |
| | | | 348/273 |
| 8,492,695 B2* | 7/2013 | Horikoshi | H01L 27/14625 |
| | | | 250/208.1 |
| 8,525,098 B2* | 9/2013 | Toumiya | H01L 27/14625 |
| | | | 250/208.1 |
| 8,670,053 B2* | 3/2014 | Kumagai | H01L 27/14627 |
| | | | 348/273 |
| 8,866,251 B2* | 10/2014 | Hirano | H01L 27/14612 |
| | | | 257/431 |
| 8,890,055 B2* | 11/2014 | Ogino | G01J 1/02 |
| | | | 250/208.1 |
| 9,331,114 B2* | 5/2016 | Tomimatsu | H01L 27/14629 |
| 9,553,199 B2* | 1/2017 | Hou | H01L 29/78642 |
| 9,666,622 B2* | 5/2017 | Tomita | G02B 6/4295 |
| 2005/0051811 A1* | 3/2005 | Tanaka | H01L 27/14689 |
| | | | 257/233 |
| 2010/0133420 A1* | 6/2010 | Ogino | G01J 1/02 |
| | | | 250/227.2 |
| 2010/0310988 A1* | 12/2010 | Abe | G03F 7/0046 |
| | | | 430/270.1 |
| 2011/0242376 A1* | 10/2011 | Ando | H01L 27/14623 |
| | | | 348/294 |
| 2012/0199893 A1* | 8/2012 | Okabe | H01L 27/14641 |
| | | | 257/291 |
| 2017/0033006 A1* | 2/2017 | Siew | H01L 21/31116 |
| 2017/0125450 A1* | 5/2017 | Hodo | H01L 27/1225 |

FOREIGN PATENT DOCUMENTS

| | | | | |
|---|---|---|---|---|
| JP | 2003224249 | * | 8/2003 | G02B 5/20 |
| JP | 2004-193500 A | | 7/2004 | |
| JP | 2008-103757 A | | 5/2008 | |
| JP | 2011-508457 A | | 3/2011 | |
| JP | 2011-119362 | * | 6/2011 | H01L 27/14 |
| JP | 2011-119362 A | | 6/2011 | |
| JP | 2011119362 | * | 6/2011 | H01L 27/14 |
| WO | 2009/091484 A1 | | 7/2009 | |

OTHER PUBLICATIONS

JP 2004-193500, U.S. Pat. No. 7,442,973 B2, U.S. Pat. No. 7,842,986 B2.

JP 2011-508457, WO2009/091484.

* cited by examiner

METHOD OF MANUFACTURING SOLID-STATE IMAGE SENSOR

BACKGROUND OF THE INVENTION

Field of the Invention

The present invention relates to a method of manufacturing a solid-state image sensor.

Description of the Related Art

A solid-state image sensor includes, for example, a substrate including a photoelectric conversion portion, an insulating member arranged on the substrate, and a light-guide portion arranged in the insulating member and on the photoelectric conversion portion. The light-guide portion guides incident light to the photoelectric conversion portion by reflection. The light-guide portion is formed by, for example, forming the insulating member on the substrate, and then forming an opening in the insulating member and filling the opening with a translucent member having a higher refractive index than that of the insulating member.

Japanese Patent Laid-Open No. 2008-103757 discloses a structure in which an inclined angle of a side face of the upper part in a light-guide portion (an angle formed by the side face and the upper face of a substrate) is smaller than an inclined angle of a side face of the lower part in the light-guide portion. According to Japanese Patent Laid-Open No. 2008-103757, after an insulating member is formed on the substrate, a resist pattern having an opening is formed on the insulating member and the first etching as isotropic etching is performed on the insulating member by using the resist pattern as a mask. Consequently, an opening having an inclined side face is formed in the upper part in the insulating member. Then, the second etching as anisotropic etching is further performed on the insulating member in which the opening has been formed by using this resist pattern as the mask. By such a procedure, an opening for the light-guide portion is formed such that an inclined angle of a side face of the upper part in the opening becomes smaller than an inclined angle of a side face of the lower part. According to a method in Japanese Patent Laid-Open No. 2008-103757, a void is hardly generated in the light-guide portion when the light-guide portion is formed by filling the opening with a translucent member.

According to the method in Japanese Patent Laid-Open No. 2008-103757, however, the shape of the side face (inclined side face) of the opening formed by the first etching may change in the second etching and the shape of the opening for the light-guide portion obtained after the second etching may deviate from a desired shape. Therefore, in the light-guide portion obtained by filling the opening with the translucent member, a light collection amount may decrease by decreasing the upper diameter of the light-guide portion or incident light may not be reflected properly toward the photoelectric conversion portion. This may cause a decrease in the light collection characteristic of the light-guide portion.

SUMMARY OF THE INVENTION

The present invention provides a technique advantageous in preventing, in a solid-state image sensor which includes a light-guide portion in which an inclined angle of a side face of the upper part is smaller than an inclined angle of a side face of the lower part, a decrease in the light collection characteristic of the light-guide portion.

One of the aspects of the present invention provides a method of manufacturing a solid-state image sensor, the method comprising preparing a substrate which includes a photoelectric conversion portion, and an insulating member which is provided on the substrate, forming, above the photoelectric conversion portion, a first opening in the insulating member, the first opening having a bottom face apart from an upper face of the substrate and having a first side face inclined to the upper face of the substrate, forming a first member so as to fill the first opening, forming, above the photoelectric conversion portion, a second opening in the first member, forming, above the photoelectric conversion portion, a third opening in the insulating member by etching a portion of the insulating member between the second opening and the photoelectric conversion portion by using the first member having the second opening as a mask, the third opening having a second side face, and forming a second member so as to fill the third opening, wherein an angle formed by the first side face and the upper face of the substrate is smaller than an angle formed by the second side face and the upper face of the substrate.

Further features of the present invention will become apparent from the following description of exemplary embodiments with reference to the attached drawings.

DESCRIPTION OF THE EMBODIMENTS (Structural Example of Solid-State Image Sensor)

Figure 1:
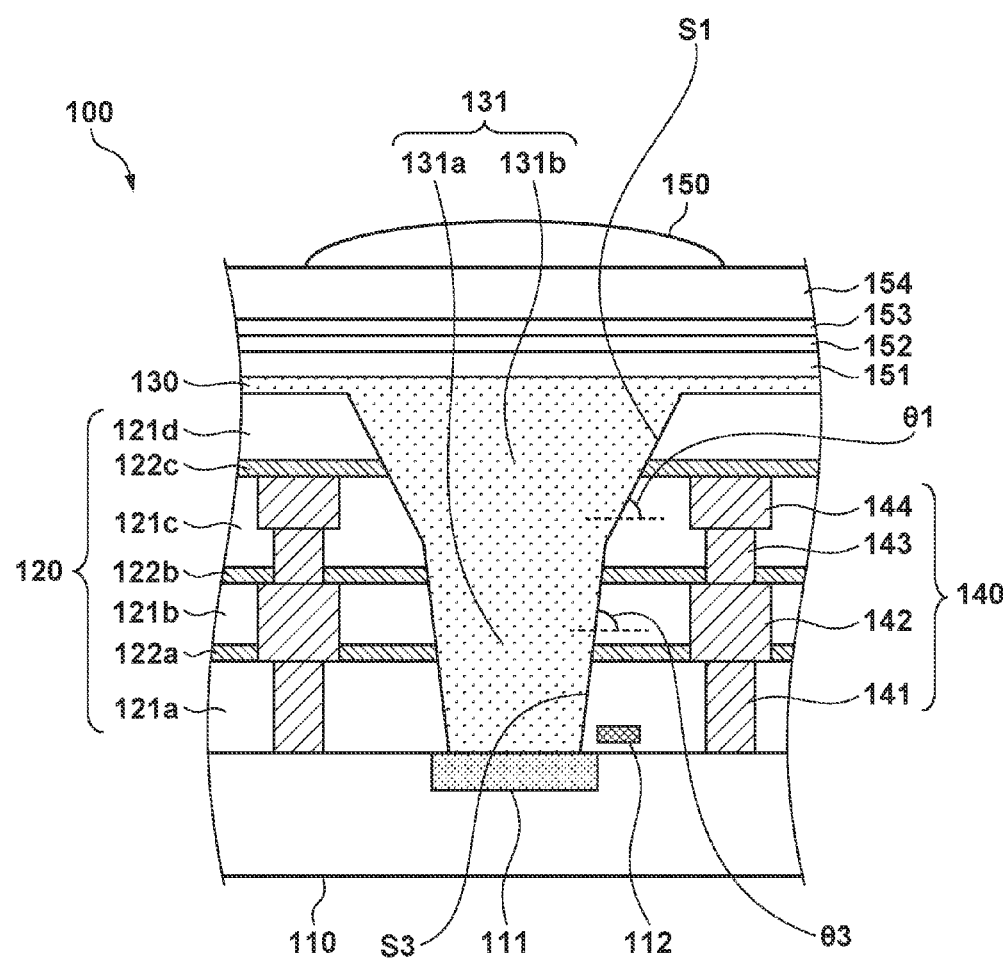
FIG. 1 is a view for explaining an example of the structure of a solid-state image sensor.

An example of the structure of a solid-state image sensor 100 according to the present invention will be described with reference to FIG. 1. FIG. 1 shows a unit pixel in an image capturing region of the solid-state image sensor 100. The solid-state image sensor 100 includes, for example, a substrate 110, an insulating member 120 arranged on the substrate 110, a light-guide portion 131 arranged in the insulating member 120, and an optical element 150 arranged above the light-guide portion 131. For example, a photoelectric conversion portion 111 and a transistor configured to read out charges generated in the photoelectric conversion portion 111 as signals are formed in the substrate 110. In FIG. 1, a gate electrode 112 of the transistor is exemplified.

The insulating member 120 is formed by, for example, stacking a plurality of insulating layers. In this example, the insulating member 120 includes silicon oxide layers 121a to 121d and silicon carbide layers 122a to 122c. More specifically, the silicon oxide layer 121a, the silicon carbide layer 122a, the silicon oxide layer 121b, the silicon carbide layer 122b, the silicon oxide layer 121c, the silicon carbide layer 122c, and the silicon oxide layer 121d are arranged in this order from the lower side to the upper side.

The light-guide portion 131 is arranged in the insulating member 120 and on the photoelectric conversion portion 111. The light-guide portion 131 is obtained by forming a translucent member 130 so as to form an opening in the insulating member 120, and then to fill the opening while covering the insulating member 120. The light-guide portion 131 can be formed such that its refractive index becomes higher than each refractive index of the at least some layers of the insulating member 120. For example, a member having a high refractive index such as silicon nitride is used for the member 130. With such a structure, the light-guide portion 131 guides incident light to the photoelectric conversion portion 111 by refraction.

The light-guide portion 131 includes a first portion 131a on the side of the photoelectric conversion portion 111 and a second portion 131b on it. An angle θ1 formed by the side face S1 of the portion 131b and the upper face of the substrate 110 is smaller than an angle θ3 formed by the side face S3 of the portion 131a and the upper face of the substrate 110. As described above, the light-guide portion 131 is obtained by filling the opening formed in the insulating member 120 with the member 130. At this time, by forming the opening with the side face of the upper portion of the opening (the upper part of the opening) being inclined, it is possible to prevent the upper portion of the opening from being closed with the member having the high refractive index before the member having the high refractive index is deposited appropriately in the lower portion of the opening (the lower part of the opening). Therefore, a void (a cavity caused by an embedding defect) is hardly generated in the light-guide portion 131 when the light-guide portion 131 is formed by filling the opening with the member having the high refractive index.

Note that the word "inclination" refers to neither a horizontal state nor a vertical state to the upper face of the substrate 110, and an angle formed by an inclined side face (e.g. S1 or S3) and the upper face of the substrate 110 may be expressed as an "inclined angle" of the side face. The side face S3 of the portion 131a may be inclined as shown in FIG. 1. However, it may almost be perpendicular to the upper face of the substrate 110. In order to increase the light collection characteristic of the light-guide portion 131, a step (more specifically, a surface almost parallel to the horizontal direction) is not preferably formed in the boundary between the side face S3 of the portion 131a and the side face S1 of the portion 131b.

A wiring portion 140 is arranged in the insulating member 120. The wiring portion 140 is arranged, for example, so as to surround the light-guide portion 131 on the periphery or a part of the light-guide portion 131 in a planar view with respect to the upper face of the substrate 110 (to be simply referred to as a "planar view" hereinafter). Consequently, the wiring portion 140 prevents leakage light from a neighboring pixel or leakage light to the neighboring pixel.

The wiring portion 140 includes, for example, a plug 141, a wiring pattern 142, a plug 143, and a wiring pattern 144. The wiring pattern 142 can be arranged in the first wiring layer (a wiring layer closest to the substrate 110) and made of an electrical conducting material such as copper or aluminum. The wiring pattern 144 can be arranged in the second wiring layer (a wiring layer above the first wiring layer) and made of the electrical conducting material, like the wiring pattern 142. The plug 141 can connect the substrate 110 and the wiring pattern 142, and be made of an electrical conducting material such as tungsten. The plug 143 can connect the wiring pattern 142 and the wiring pattern 144, and be made of the electrical conducting material, like the plug 141. Note that in this example, the silicon carbide layers 122a to 122c can function as anti-metal-diffusion films.

The optical element 150 can be arranged, for example, on a silicon oxide layer 151, a passivation film 152, a planarizing layer 153, and a color filter 154 above the member 130 which forms the light-guide portion 131. In another example, between the optical element 150 and the member 130, the above-described layers, film, or only some of the members 151 to 154 may be arranged, or another layer, film, or member may further be arranged as needed.

The solid-state image sensor 100 exemplified above can be manufactured by using a well-known semiconductor manufacturing process. Some examples of a method of manufacturing the solid-state image sensor 100 according to the present invention will be described by paying attention to a step of forming the light-guide portion 131.

First Example

The first example of the method of manufacturing a solid-state image sensor 100 will be described with reference to FIGS. 2A to 2H. In a step of FIG. 2A, a substrate 110 where a photoelectric conversion portion 111, a gate electrode 112, and the like are formed is prepared, and then an insulating member 120 is formed on the substrate 110. As described above, the insulating member 120 includes, for example, silicon oxide layers 121a to 121d and silicon carbide layers 122a to 122c. The insulating member 120 can be formed, for example, by repeating CVD (chemical vapor deposition) and CMP (chemical mechanical polishing) alternately. Note that during each step of forming the insulating member 120, a wiring portion 140 (plugs 141 and 143, and wiring patterns 142 and 144) can be formed at a desired position in the insulating member 120 by using PVD (physical vapor deposition), a damascene method, or the like.

Figure 2A:
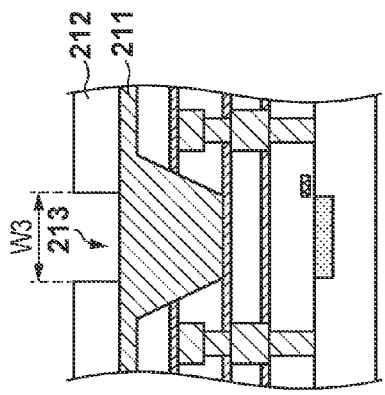
FIGS. 2A to 2H are views for explaining an example of a method of manufacturing the solid-state image sensor.
Figure 2B:
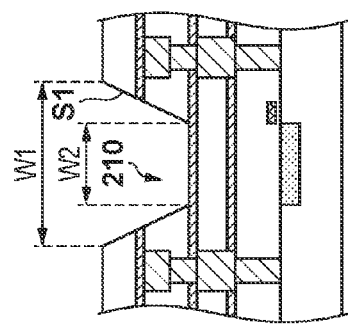

In a step of FIG. 2B, an opening 210 is formed in the upper part of the insulating member 120. The opening 210 is formed such that its side face S1 is inclined. For example, letting W1 be a width of the opening 210 flush with the upper face of the insulating member 120, and W2 be a width of the bottom face of the opening 210, the relation of W1>W2 holds. This step can be performed by, for example, plasma etching. Etching conditions (for example, the mixture ratio, the temperature, and the like of an etching gas) can be adjusted such that the opening 210 is formed with its side face S1 being inclined.

In this example, a mode has been described in which the opening 210 is formed so as to expose the silicon carbide layer 122b. However, the depth of the opening 210 is not limited to this example. Etching conditions when the silicon oxide layers 121d and 121c are etched and etching conditions when the silicon carbide layer 122c is etched can be adjusted such that the side face S1 of the opening 210 becomes substantially straight.

Figure 2C:
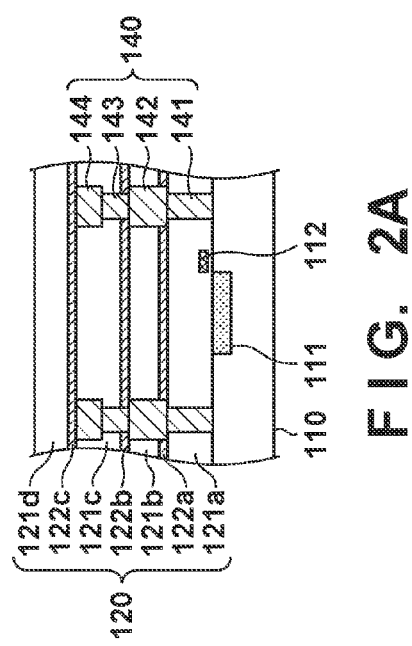

In a step of FIG. 2C, a resin 211 is formed on the insulating member 120 so as to fill the opening 210 while covering the upper face of the insulating member 120, and a resist pattern 212 having an opening 213 is further formed on the resin 211. The opening 213 is formed in the planar view such that its outer edge overlaps the side face S1 of the opening 210. That is, letting W3 be a width of the opening 213, the relation of W1>W3>W2 holds. Note that the resin 211 can be formed by, for example, spin coating. A predetermined planarizing process such as CMP may be performed on the upper face of the resin 211, as needed.

Figure 2D:
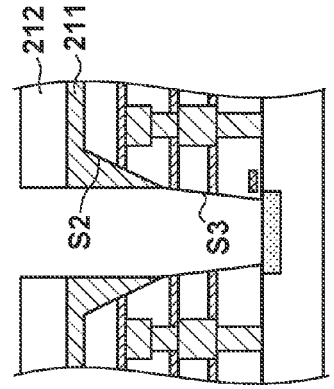

In a step of FIG. 2D, a part under the opening 213 as a part of the resin 211 is etched by using the resist pattern 212 as a mask. This step can be performed by, for example, plasma etching. By this step, an opening 214 is formed in the resin 211. The opening 214 is formed so as to expose the bottom face of the opening 210 and a part of the vicinity (periphery) of the bottom face as a part of the side face S1 of the opening 210. In other words, a state is obtained in which a portion other than the part of the side face S1 of the opening 210 (a portion outside the part in the planar view) is covered with the resin 211. In FIG. 2D, a portion of the side face S1 which is covered with the resin 211 is denoted by "S2".

Figure 2E:
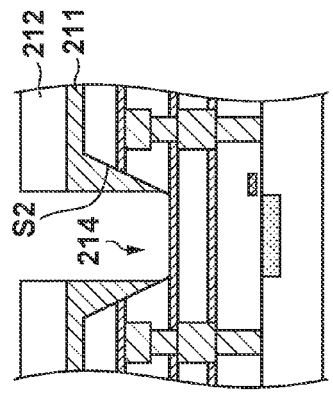

In a step of FIG. 2E, a portion of the insulating member 120 under the opening 214 is etched by using the resist pattern 212 and the resin 211 where the opening 214 has been formed as masks. This step can be performed by, for example, plasma etching. An etching stopper made of silicon nitride or the like may be arranged on the photoelectric conversion portion 111 of the substrate 110. In this case, this step can be completed in accordance with exposure of the etching stopper. Note that in this step, the portion S2 of the side face S1 of the opening 210 is covered with the resin 211. Therefore, the portion S2 is not further etched by plasma etching in this step and its shape does not change.

Figure 2F:
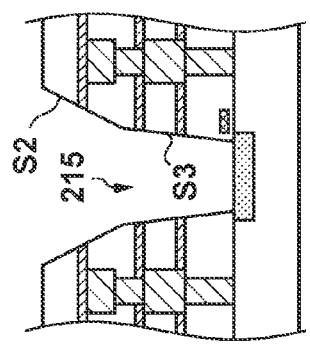

In a step of FIG. 2F, the resin 211 is peeled off by using a peeling material and is removed. By this step, a state is obtained in which an opening 215 is formed in the insulating member 120.

According to the above-described procedure, the opening 215 is formed such that an angle θ1 formed by the side face S1 of the upper portion of the opening and the upper face of the substrate 110 becomes smaller than an angle θ3 formed by the side face S3 of the lower portion of the opening and the upper face of the substrate 110.

Figure 2H:
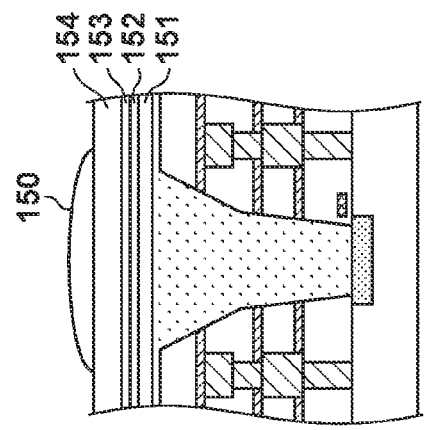
Figure 2G:
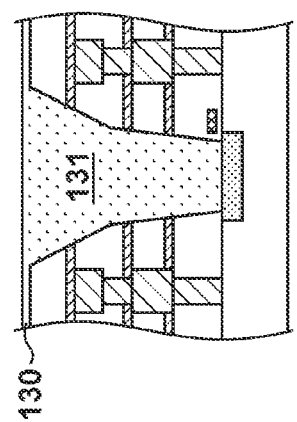

In a step of FIG. 2G, a light-guide portion 131 is formed by filling the opening 215 with a member 130 by, for example, high-density plasma CVD. Silicon nitride or the like can be used for the member 130. However, another member made of a material having a high refractive index may be used and, for example, an organic material such as a resin may be used. The member to fill the opening 215 may be the same material (for example, silicon oxide) as the material contained in the insulating member 120 or may be a material having a lower refractive index than that of the material contained in the insulating member 120. Multiple reflection among a plurality of layers having different refractive indices can be reduced by filling the opening 215 with a uniform material even if the insulating member 120 is formed by these plurality of layers.

Note that CMP may be performed on the upper face of the member 130 to the extent that the upper face of the insulating member 120 is not exposed. If portions made of different materials exist on the upper face, the difference in the polishing rate may be made between them, causing a height difference on the upper face. It is therefore possible to planarize the upper face of the insulating member 120 appropriately by not exposing the upper face.

In a step of FIG. 2H, an optical element 150 is formed on a silicon oxide layer 151, a passivation film 152, a planarizing layer 153, and a color filter 154 above the member 130 which forms the light-guide portion 131. As described above, the structure of the solid-state image sensor 100 exemplified in FIG. 1 is obtained.

According to this example, in the step of FIG. 2E, the portion S2 of the side face S1 of the opening 210 is covered with the resin 211. Therefore, the portion S2 is not further etched by plasma etching in this step and its shape does not change. It is therefore possible to prevent the shape of the opening 215 (in addition, the shape of the light-guide portion 131 obtained by filling the opening 215 with the member 130) obtained in the step of FIG. 2F from deviating from a desired shape. Hence, this example is advantageous in preventing a decrease in the light collection characteristic of the light-guide portion 131.

Second Example

The second example of the method of manufacturing a solid-state image sensor 100 will be described with reference to FIG. 3. A step of FIG. 3A is performed after an opening 210 is formed in an insulating member 120 with the same procedure as in the first example described above, that is, after the step of FIG. 2B.

Figure 3A:
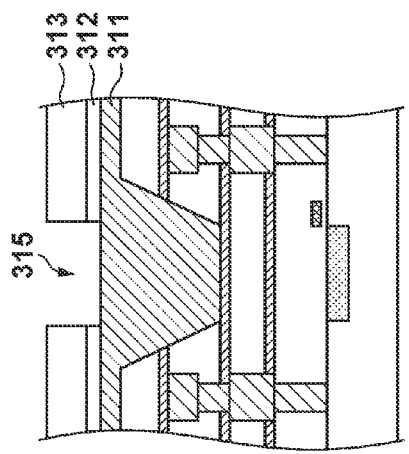
FIGS. 3A to 3C are views for explaining an example of the method of manufacturing the solid-state image sensor.

In the step of FIG. 3A, after a resin 311 is formed on the insulating member 120 so as to fill the opening 210 while covering the upper face of the insulating member 120, silicon oxide 312 is formed on the resin 311 and a resist pattern 313 is further formed on the silicon oxide 312. The resist pattern 313 has an opening 314. The opening 314 is formed in the planar view such that its outer edge overlaps a side face S1 of the opening 210. That is, letting W4 be a width of the opening 314, the relation of W1>W4>W2 holds. Note that as described above in the first example, W1 denotes the width of the opening 210 flush with the upper face of the insulating member 120, and W2 denotes the width of the bottom face of the opening 210.

Figure 3B:
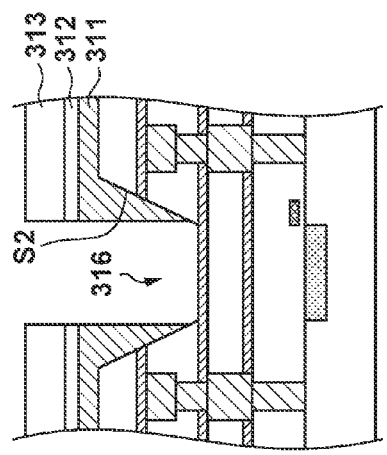

In a step of FIG. 3B, a part under the opening 314 as a part of the silicon oxide 312 is etched by using the resist pattern 313 as a mask. This step can be performed by, for example, plasma etching. By this step, an opening 315 is formed in the silicon oxide 312.

Figure 3C:
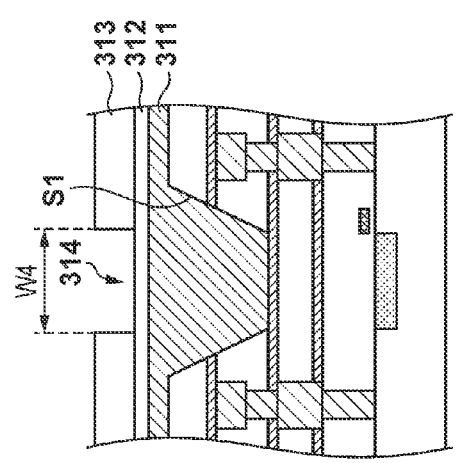

In a step of FIG. 3C, a part under the opening 315 as a part of the resin 311 is etched by using the resist pattern 313 and the silicon oxide 312 where the opening 315 has been formed as masks. This step can be performed by, for example, plasma etching. By this step, an opening 316 is formed in the resin 311.

After the step of FIG. 3C, a part under the opening 316 as a part of the insulating member 120 is etched by using the silicon oxide 312 and the resin 311 as masks. The silicon oxide 312 can be etched together with the insulating member 120 in this step. However, the resin 311 functions as the mask after the silicon oxide 312 is etched, resulting in obtaining the same structure as the structure after the step of FIG. 2E. Then, the same steps as in FIGS. 2F to 2H can further be performed.

According to this example, in the step of FIG. 3C, a portion S2 of the side face S1 of the opening 210 is covered with the resin 311. Therefore, the portion S2 is not further etched by plasma etching in this step and its shape does not change. Hence, the same effect as in the first example is also obtained in this example.

Third Example

The third example of the method of manufacturing a solid-state image sensor 100 will be described with reference to FIG. 4. A step of FIG. 4A is performed after an opening 210 is formed in an insulating member 120 with the same procedure as in the first example described above, that is, after the step of FIG. 2B.

Figure 4A:
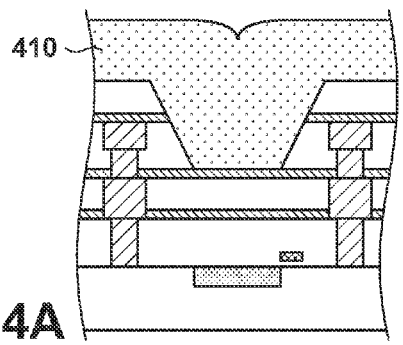
FIGS. 4A to 4E are views for explaining an example of the method of manufacturing the solid-state image sensor.

In the step of FIG. 4A, a member 410 having a high refractive index such as silicon nitride is formed on the insulating member 120 so as to fill the opening 210 while covering the upper face of the insulating member 120. This step can be performed by, for example, high-density plasma CVD.

Figure 4B:
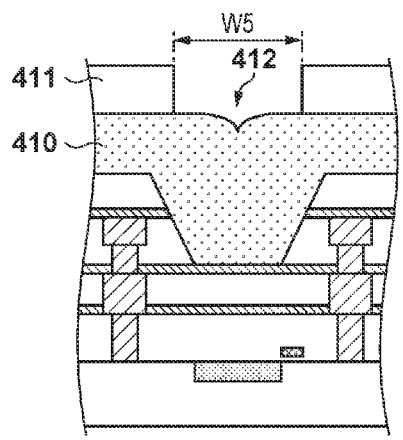

In a step of FIG. 4B, a resist pattern 411 having an opening 412 is formed on the member 410. The opening 412 is formed in the planar view such that its outer edge overlaps a side face S1 of the opening 210. That is, letting W5 be a width of the opening 412, the relation of W1>W5>W2 holds. Note that as described above in the first example, W1 denotes the width of the opening 210 flush with as the upper face of the insulating member 120, and W2 denotes the width of the bottom face of the opening 210.

Figure 4C:
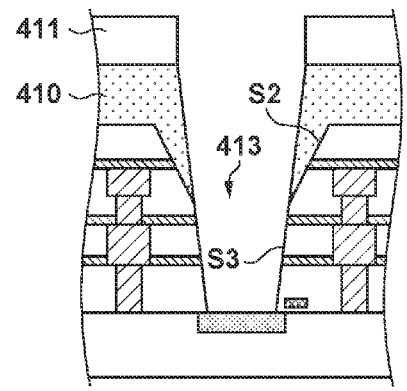

In a step of FIG. 4C, a part under the opening 412 as a part of the member 410 and a part under the opening 412 as a part of the insulating member 120 are etched by using the resist pattern 411 as a mask. This step can be performed by, for example, plasma etching. By this step, an opening 413 is formed in the member 410 and the insulating member 120. At this time, the opening 413 is preferably formed such that its side face is inclined.

Figure 4D:
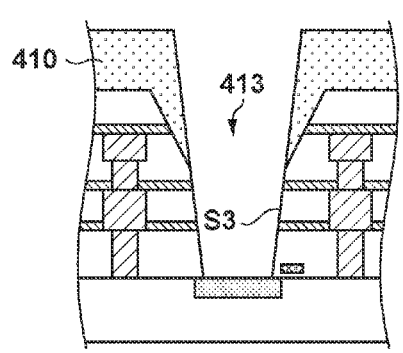

In a step of FIG. 4D, the resist pattern 411 is peeled off by using the peeling material and is removed.

Figure 4E:
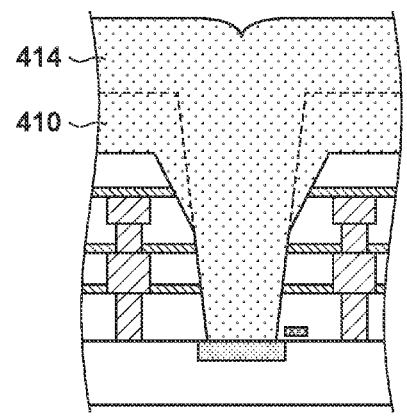

In a step of FIG. 4E, a member 414 (silicon nitride in this example) made of the same material as that of the member 410 is formed so as to fill the opening 413 while covering the upper face of the member 410. This step can be performed by, for example, high-density plasma CVD. Note that the opening 413 is formed such that its side face is inclined in the step of FIG. 4C, hardly generating voids when the opening 413 is filled with the member 414.

After the step of FIG. 4E, CMP is performed on the upper faces of the members 410 and 414. Consequently, the same structure as the structure after the step of FIG. 2G is obtained. Then, the same step as in FIG. 2H can be performed.

According to this example, in the step of FIG. 4C, a portion S2 of the side face S1 of the opening 210 is covered with the member 410. Therefore, the portion S2 is not further etched by plasma etching in this step and its shape does not change. Hence, the same effect as in the first and second examples is also obtained in this example.

(Others)

Some preferred embodiments have been exemplified above. However, the present invention is not limited to these embodiments. Some embodiments may be changed or several characteristics of the respective embodiments may be combined, without departing from the scope of the present invention.

(Imaging System)

Figure 5:
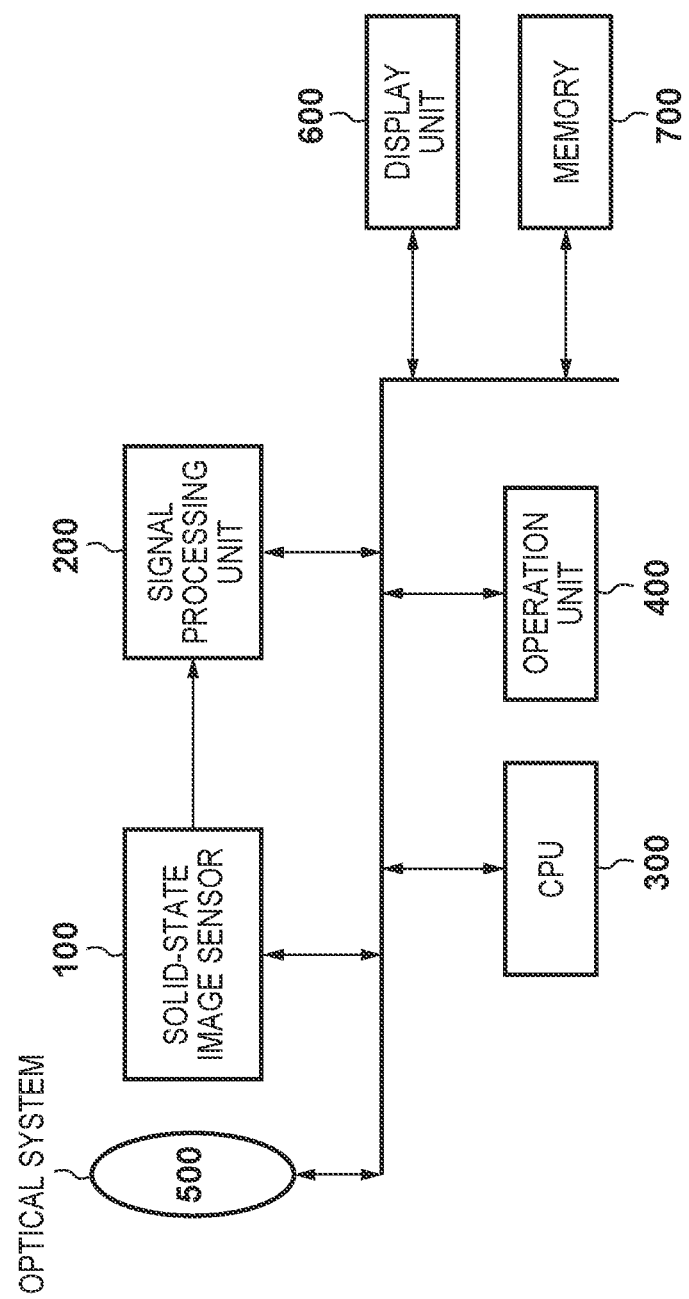
FIG. 5 is a block diagram for explaining an example of the arrangement of a camera.

FIG. 5 is a block diagram for explaining an example of the arrangement of a camera to which the solid-state image sensor 100 shown in the above-described examples is applied. In addition to the solid-state image sensor 100, the camera includes, for example, a signal processing unit 200, a CPU 300 (or a processor), an operation unit 400, and an optical system 500. The camera can further include a display unit 600 configured to display a still image and a moving image to a user, and a memory 700 configured to store their data. The solid-state image sensor 100 generates image data based on light that has passed through the optical system 500. The image data undergoes predetermined correction processing by the signal processing unit 200 and is output to the display unit 600 or the memory 700. The CPU 300 can change setting information of each unit or a control method of each unit in accordance with a shooting condition input via the operation unit 400 by the user. Note that the concept of the camera includes not only apparatuses primarily aiming at shooting but also apparatuses (for example, personal computer and portable terminal) secondarily having a shooting function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-140060, filed Jul. 13, 2015, which is hereby incorporated by reference herein in its entirety.

What is claimed is:

1. A method of manufacturing a solid-state image sensor, the method comprising:

preparing a substrate which includes a photoelectric conversion portion, and an insulating member which is provided on the substrate;

forming, above the photoelectric conversion portion, a first opening in the insulating member, the first opening having a bottom face apart from an upper face of the substrate and having a first side face, the first side face being formed by a surface of the insulating member, the surface being inclined both to a direction parallel to the upper face of the substrate and to a direction normal to the upper face of the substrate;

forming a first member in the first opening;

forming, above the photoelectric conversion portion, a second opening in the first member;

forming, above the photoelectric conversion portion, a third opening in the insulating member by etching a portion of the insulating member between the second opening and the photoelectric conversion portion by using the first member having the second opening as a mask, the third opening having a second side face; and forming a second member in the third opening, wherein an angle formed by the first side face and the upper face of the substrate is smaller than an angle formed by the second side face and the upper face of the substrate, wherein in the forming the second opening, the second opening is formed by etching using a resist pattern having an opening therein, and wherein W1>W3>W2, where W1 is a width of the first opening flush with an upper face of the insulating member, W2 is a width of a bottom face of the first opening, and W3 is a width of the opening in the resist pattern.

2. The method according to claim 1, further comprising removing the first member where the second opening has been formed after the forming the third opening and before the forming the second member.

3. The method according to claim 2, wherein the insulating member contains at least silicon oxide, wherein the first member contains a resin, and wherein the second member contains silicon nitride.

4. The method according to claim 1, wherein the forming the second opening includes:

forming, on the first member, a resist pattern having an opening such that an outer edge of the opening overlaps the first side face in a planar view with respect to the upper face of the substrate, and etching, by using the resist pattern as a mask, a part of the first member so as to expose the bottom face of the first opening and a part of a vicinity of the bottom face as a part of the first side face.

5. The method according to claim 1, wherein in the forming the third opening, in a planar view with respect to the upper face of the substrate, a part of the first side face is covered with the first member.

6. The method according to claim 5, wherein the insulating member contains at least silicon oxide, and wherein the first member and the second member contain silicon nitride.

7. The method according to claim 1, further comprising, after the forming the second member, planarizing an upper face of the second member so as not to expose an upper face of the insulating member.

8. The method according to claim 1, wherein in the forming the second member, a light-guide portion is formed by filling the third opening with the second member, and
wherein the method of manufacturing the solid-state image sensor further comprises forming an optical element on the light-guide portion after the forming the second member.

9. The method according to claim 1, wherein in the forming the first member, the first member fills the first opening, and
wherein in the forming the second member, the second member fills the third opening.

10. The method according to claim 1, wherein in the forming the first member, a non-photosensitive member is used as the first member.

11. The method according to claim 1, wherein the first opening and the third opening are formed such that the first side face and the second side face form an obtuse angle.

12. The method according to claim 1, wherein the first side face and the second side face are connected to each other such that a bottom end of the first side face and an upper end of the second side face are matched with each other.

13. The method according to claim 1, wherein in the forming the second member, the second member is formed in the third opening under a condition that the first member covers the first side face.

14. The method according to claim 1, wherein the second side face is a face which is inclined both to the direction parallel to the upper face of the substrate and to the direction normal to the upper face of the substrate.

15. A method of manufacturing a solid-state image sensor, the method comprising:
preparing a substrate which includes a photoelectric conversion portion, and an insulating member which is provided on the substrate;
forming, above the photoelectric conversion portion, a first opening in the insulating member, the first opening having a bottom face apart from an upper face of the substrate and having a first side face inclined to the upper face of the substrate;
forming a first member so as to fill the first opening;
forming, above the photoelectric conversion portion, a second opening in the first member;
forming, above the photoelectric conversion portion, a third opening in the insulating member by etching a portion of the insulating member between the second opening and the photoelectric conversion portion by using the first member having the second opening as a mask, the third opening having a second side face; and
forming a second member so as to fill the third opening,
wherein an angle formed by the first side face and the upper face of the substrate is smaller than an angle formed by the second side face and the upper face of the substrate,
wherein in the forming the second opening, a third member is formed on the first member,
wherein a resist pattern having a fourth opening is formed on the third member,
wherein a part of the third member is etched by using the resist pattern as a mask, and
wherein a part of the first member is etched, by using as a mask the third member the part of which has been etched, so as to expose the bottom face of the first opening and a part of a vicinity of the bottom face as a part of the first side face.

16. The method according to claim 15, wherein the first side face and the second side face are connected to each other such that a bottom end of the first side face and an upper end of the second side face are matched with each other.

17. A method of manufacturing a solid-state image sensor, the method comprising:
preparing a substrate which includes a photoelectric conversion portion, and an insulating member which is provided on the substrate;
forming, above the photoelectric conversion portion, a first opening in the insulating member, the first opening having a bottom face apart from an upper face of the substrate and having a first side face inclined to the upper face of the substrate;
forming a first member so as to fill the first opening;
forming, above the photoelectric conversion portion, a second opening in the first member;
forming, above the photoelectric conversion portion, a third opening in the insulating member by etching a portion of the insulating member between the second opening and the photoelectric conversion portion by using the first member having the second opening as a mask, the third opening having a second side face; and
forming a second member so as to fill the third opening,
wherein an angle formed by the first side face and the upper face of the substrate is smaller than an angle formed by the second side face and the upper face of the substrate,
wherein in the forming the second opening, on the first member, a resist pattern having a fourth opening is formed, and the second opening is formed by etching a portion of the first member under the fourth opening by using the resist pattern as a mask, and
wherein, in the forming the third opening, the third opening is formed by etching a portion of the insulating member under the fourth opening by using the resist pattern and the first member as masks.

18. The method according to claim 17,
wherein $W1 > W3 > W2$, where $W1$ is a width of the first opening flush with an upper face of the insulating member, $W2$ is a width of a bottom face of the first opening, and $W3$ is a width of the fourth opening in the resist pattern.

* * * * *